(12) United States Patent
Tsai et al.

(10) Patent No.: US 10,529,726 B2
(45) Date of Patent: Jan. 7, 2020

(54) METHOD OF MANUFACTURING MEMORY STRUCTURE

(71) Applicant: Winbond Electronics Corp., Taichung (TW)

(72) Inventors: Yi-Tsung Tsai, Taichung (TW); Yu-Chun Yang, Taichung (TW); Fang-Wei Lin, Taichung (TW); Hsin-Li Kuo, Taichung (TW)

(73) Assignee: Winbond Electronics Corp., Taichung (TW)

( * ) Notice: Subject to any disclaimer, the term of this patent is extended or adjusted under 35 U.S.C. 154(b) by 0 days.

(21) Appl. No.: 16/529,815

(22) Filed: Aug. 2, 2019

(65) Prior Publication Data
US 2019/0355732 A1 Nov. 21, 2019

Related U.S. Application Data

(62) Division of application No. 15/677,033, filed on Aug. 15, 2017, now Pat. No. 10,438,957.

(30) Foreign Application Priority Data

Jul. 6, 2017 (CN) .......................... 2017 1 0545488

(51) Int. Cl.
| | | |
|---|---|---|
| *H01L 21/336* | (2006.01) | |
| *H01L 27/11521* | (2017.01) | |
| *H01L 21/768* | (2006.01) | |
| *H01L 23/29* | (2006.01) | |
| *H01L 29/788* | (2006.01) | |
| *H01L 29/66* | (2006.01) | |
| *H01L 21/28* | (2006.01) | |
| *H01L 23/31* | (2006.01) | |
| *H01L 23/535* | (2006.01) | |

(Continued)

(52) U.S. Cl.
CPC .. *H01L 27/11521* (2013.01); *H01L 21/76802* (2013.01); *H01L 21/76877* (2013.01); *H01L 21/76895* (2013.01); *H01L 23/291* (2013.01); *H01L 23/3171* (2013.01); *H01L 23/3192* (2013.01); *H01L 23/535* (2013.01); *H01L 29/40114* (2019.08); *H01L 29/42324* (2013.01); *H01L 29/6656* (2013.01); *H01L 29/66825* (2013.01); *H01L 29/788* (2013.01); *H01L 21/0217* (2013.01); *H01L 21/31116* (2013.01)

(58) Field of Classification Search
None
See application file for complete search history.

(56) References Cited

U.S. PATENT DOCUMENTS

| | | | | |
|---|---|---|---|---|
| 7,292,599 B2* | 11/2007 | Khawer | ............ | H04L 29/12009 370/252 |
| 7,297,599 B2* | 11/2007 | Ohtani | .................. | H01L 27/115 257/E21.68 |
| 2004/0132251 A1* | 7/2004 | Yoshino | ................ | H01L 21/265 438/267 |

* cited by examiner

*Primary Examiner* — Ali Naraghi
(74) *Attorney, Agent, or Firm* — JCIPRNET (57) ABSTRACT

A manufacturing method of a memory structure including the following steps is provided. A memory cell structure is formed on a substrate. The memory cell structure has a first side and a second side opposite to each other. A protective layer structure covering the memory cell structure is formed. The material of the protective layer structure is nitride. The protective layer structure is a continuous structure. The height of the protective layer structure adjacent to the second side of the memory cell structure is greater than the height of the protective layer structure adjacent to the first side of the memory cell structure.

7 Claims, 7 Drawing Sheets

(51) Int. Cl.
*H01L 29/423* (2006.01)
*H01L 21/02* (2006.01)
*H01L 21/311* (2006.01)

METHOD OF MANUFACTURING MEMORY STRUCTURE

CROSS-REFERENCE TO RELATED APPLICATION

This application is a divisional application of and claims the priority benefit of U.S. application Ser. No. 15/677,033, filed on Aug. 15, 2017, which claims the priority benefit of China application serial no. 201710545488.X, filed on Jul. 6, 2017. The entirety of each of the above-mentioned patent applications is hereby incorporated by reference herein and made a part of this specification.

BACKGROUND OF THE INVENTION

Field of the Invention

The invention relates to a semiconductor structure and a manufacturing method thereof, and more particularly, to a memory structure and a manufacturing method thereof.

Description of Related Art

For a memory device (such as flash memory), data retention is one of the most important features thereof, and therefore how to increase the reliability of the memory device has always been an issue of concern in the industry.

However, when a traditional process defines a contact via an etching process, damage to the top corners of the memory cell often occurs, such that the coverage of the dielectric layer for the memory cell is affected, and reliability is compromised as a result. Moreover, in the case of poor coverage of the nitride layer for covering the memory cell structure, the nitride layer is not continuous, and a breach is formed in the nitride layer. As a result, high-temperature data retention capacity is reduced, and therefore the reliability of the memory device is poor and yield is reduced.

SUMMARY OF THE INVENTION

The invention provides a memory structure and a manufacturing method thereof that can achieve better high-temperature data retention capacity.

The invention provides a memory structure including a substrate, a memory cell structure, and a protective layer structure. The memory cell structure is disposed on the substrate and has a first side and a second side opposite to each other. The protective layer structure covers the memory cell structure. The material of the protective layer structure is nitride. The protective layer structure is a continuous structure. The height of the protective layer structure adjacent to the second side of the memory cell structure is greater than the height of the protective layer structure adjacent to the first side of the memory cell structure.

The invention provides a manufacturing method of a memory structure including the following steps. A memory cell structure is formed on a substrate. The memory cell structure has a first side and a second side opposite to each other. A protective layer structure covering the memory cell structure is formed. The material of the protective layer structure is nitride. The protective layer structure is a continuous structure. The height of the protective layer structure adjacent to the second side of the memory cell structure is greater than the height of the protective layer structure adjacent to the first side of the memory cell structure.

Based on the above, in the memory structure and the manufacturing method thereof provided in the invention, the material of the protective layer structure is nitride, the protective layer structure is a continuous structure, and the height of the protective layer structure adjacent to the second side of the memory cell structure is greater than the height of the protective layer structure adjacent to the first side of the memory cell structure. Therefore, the protective layer structure has better coverage for the memory cell structure, such that the memory structure can have better high-temperature data retention capacity. As a result, the reliability and the yield of the memory structure can be increased.

In order to make the aforementioned features and advantages of the disclosure more comprehensible, embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1A:
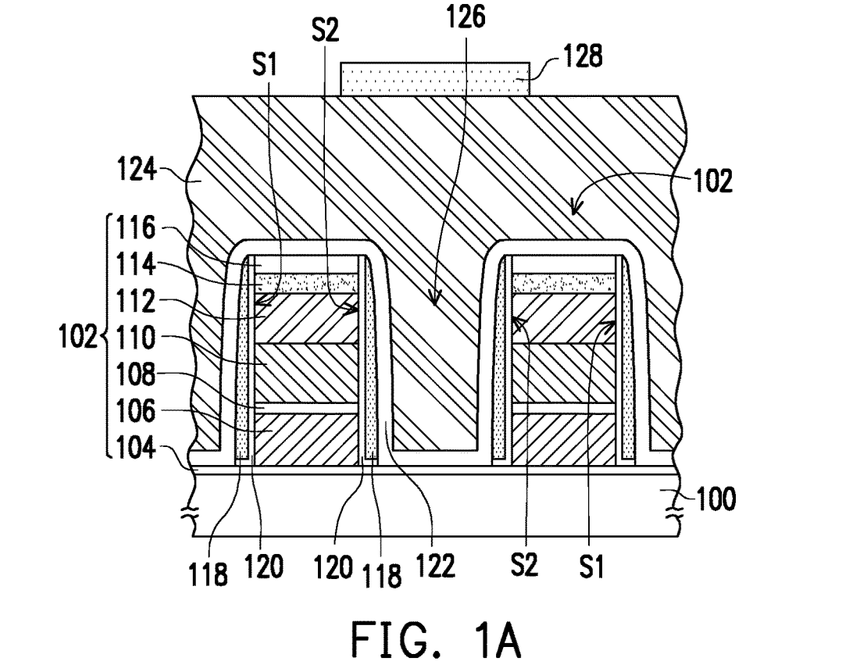
FIG. 1A to FIG. 1G are cross sections of a manufacturing process of a memory structure of an embodiment of the invention.

Referring to FIG. 1A, a memory cell structure 102 is formed on a substrate 100. The memory cell structure 102 has a first side S1 and a second side S2 opposite to each other. For instance, the first side S1 can be a drain side, and the second side S2 can be a source side, but the invention is not limited thereto.

The memory cell structure 102 can include a first dielectric layer 104, a charge storage structure 106, a second dielectric layer 108, and a first conductive layer 110. The first dielectric layer 104 is disposed on the substrate 100.

The charge storage structure 106 is disposed on the first dielectric layer 104. The charge storage structure 106 can be a floating gate.

The second dielectric layer 108 is disposed on the charge storage layer 106. The second dielectric layer 108 can be a single-layer structure or a multilayer structure.

The first conductive layer 110 is disposed on the second dielectric layer 108. The first conductive layer 110 can be used as a control gate.

Moreover, the memory cell structure 102 can further include at least one of a metal silicide layer 112, a first cap layer 114, and a second cap layer 116. The metal silicide layer 112 is disposed on the first conductive layer 110. The material of the silicide layer 112 is, for instance, nickel silicide or cobalt silicide. The forming method of the metal silicide layer 112 is, for instance, a self-aligned metal silicide process. The first cap layer 114 is disposed on the metal silicide layer 112. The material of the first cap layer 114 is, for instance, nitride, such as silicon nitride. The forming method of the first cap layer 114 is, for instance, a chemical vapor deposition method. The second cap layer 116 is disposed on the first cap layer 114. The material of the second cap layer 116 is, for instance, oxide, such as silicon oxide formed by using tetraethoxysilane (TEOS) as a reaction gas. The forming method of the second cap layer 116 is, for instance, a chemical vapor deposition method.

A first spacer 118 can be formed on the sidewall of the first side S1 of the memory cell structure 102 and on the sidewall of the second side S2 of the memory cell structure 102. The material of the first spacer 118 is, for instance, nitride, such as silicon nitride. Moreover, a second spacer 120 can further be optionally formed between the first spacer 118 and the memory cell structure 102. The material of the second spacer 120 is, for instance, oxide, such as silicon oxide. The forming method of the second spacer 120 and the first spacer 118 includes, for instance, first forming a conformal second spacer material layer (not shown) and first spacer material layer (not shown) in order, and then performing an etch-back process on the second spacer material layer and the first spacer material layer. The etch-back process is, for instance, a dry etching process.

Next, a third dielectric layer 122 covering the memory cell structure 102 and the first spacer 118 can be formed. The material of the third dielectric layer 122 is, for instance, oxide, such as silicon oxide formed by using tetraethoxysilane (TEOS) as a reaction gas. The forming method of the third dielectric layer 122 is, for instance, a chemical vapor deposition method.

Next, a sacrificial material layer 124 can be formed on the third dielectric layer 122, and the sacrificial material layer 124 is filled in a first opening 126 located at the second side S2 of the memory cell structure 102. The material of the sacrificial material layer 124 is, for instance, polysilicon.

Next, a patterned hard mask layer 128 can be formed on the sacrificial material layer 124. The material of the patterned hard mask layer 128 is, for instance, nitride, such as silicon nitride.

Figure 1B:
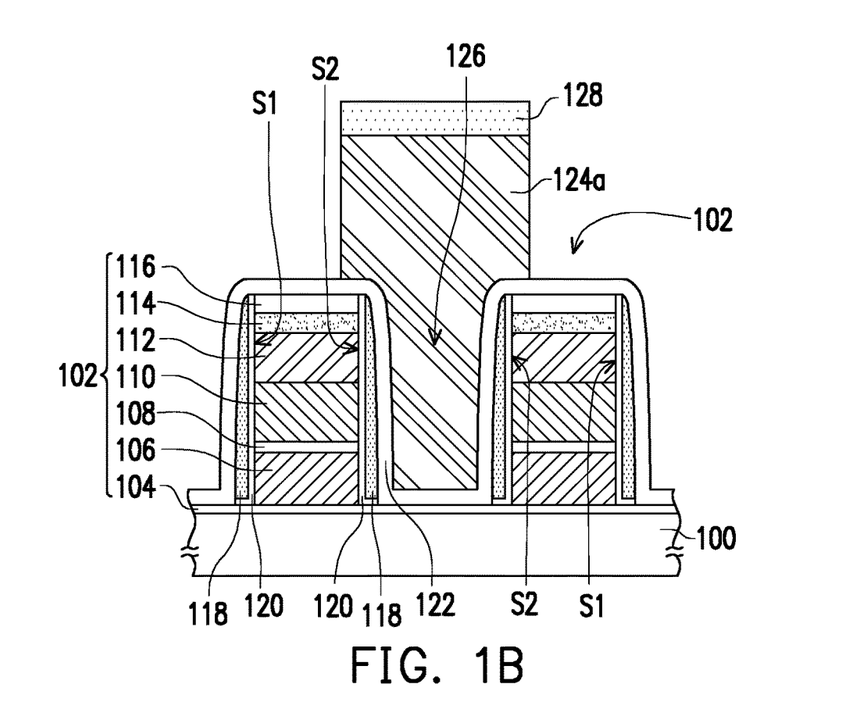

Referring to FIG. 1B, a portion of the sacrificial material layer 124 can be removed using the patterned hard mask layer 128 as a mask to form a sacrificial layer 124a filled in the first opening 126 located at the second side S2 of the memory cell structure 102. The sacrificial layer 124a covers the third dielectric layer 122 located on the top surface of the memory cell structure 102 adjacent to the second side S2. In the present embodiment, after the sacrificial layer 124a is formed, the patterned hard mask layer 128 can remain on the sacrificial layer 124a, but the invention is not limited thereto.

Figure 1C:
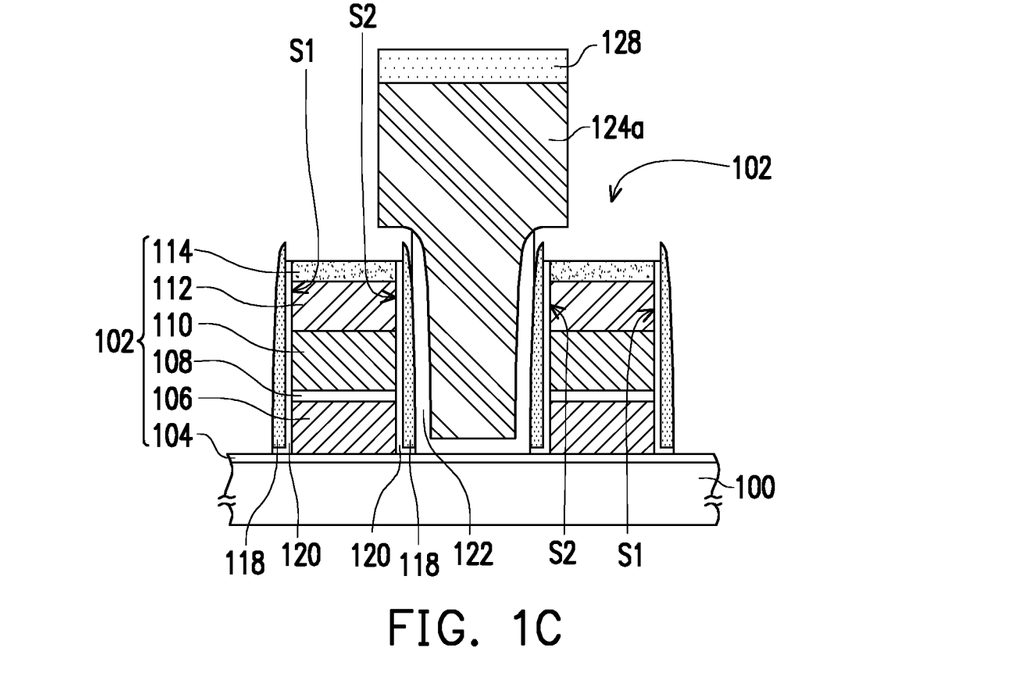

Referring to FIG. 1C, a portion of the third dielectric layer 122 can be removed to expose the first spacer 118 located at the first side S1 of the memory cell structure 102 and expose the top portion of the first spacer 118 located at the second side S2 of the memory cell structure 102. The removal method of the portion of the third dielectric layer 122 is, for instance, a SiCoNi etching method or a wet etching method. During the removal of the portion of the third dielectric layer 122, a portion of the second cap layer 116 may be removed at the same time. In the present embodiment, the second cap layer 116 is completely removed as an example. In another embodiment, a portion of the second cap layer 116 can also be kept.

Figure 1D:
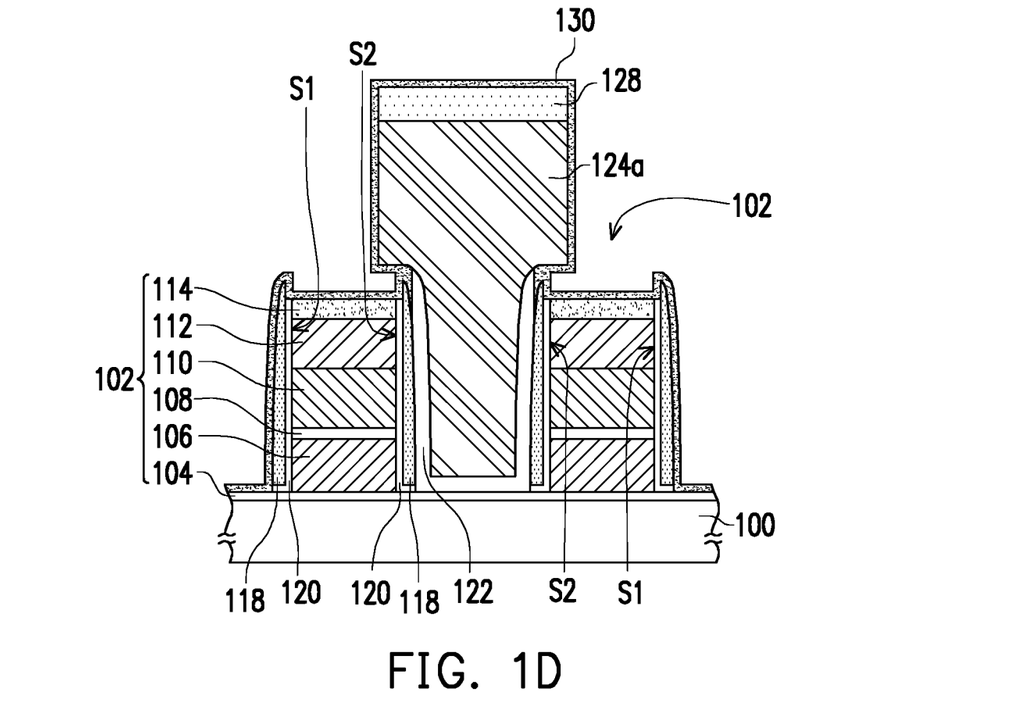

Referring to FIG. 1D, a liner layer 130 can be conformally formed on the memory cell structure 102, on the sacrificial layer 124a, and on the patterned hard mask layer 128. The liner layer 130 is connected to the first spacer 118. The material of the liner layer 130 is, for instance, nitride, such as silicon nitride. The forming method of the liner layer 130 is, for instance, a chemical vapor deposition method.

Figure 1E:
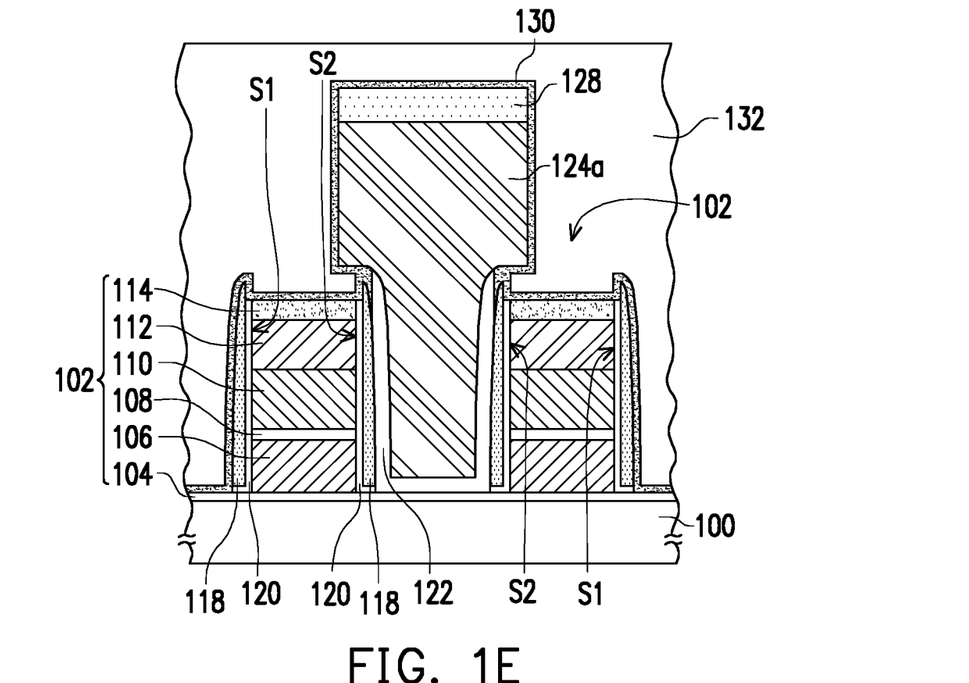

Referring to FIG. 1E, a fourth dielectric layer 132 covering the liner layer 130 can be formed. The material of the fourth dielectric layer 132 is, for instance, oxide, such as borophosphosilicate glass (BPSG). The forming method of the fourth dielectric layer 132 is, for instance, a chemical vapor deposition method.

Figure 1F:
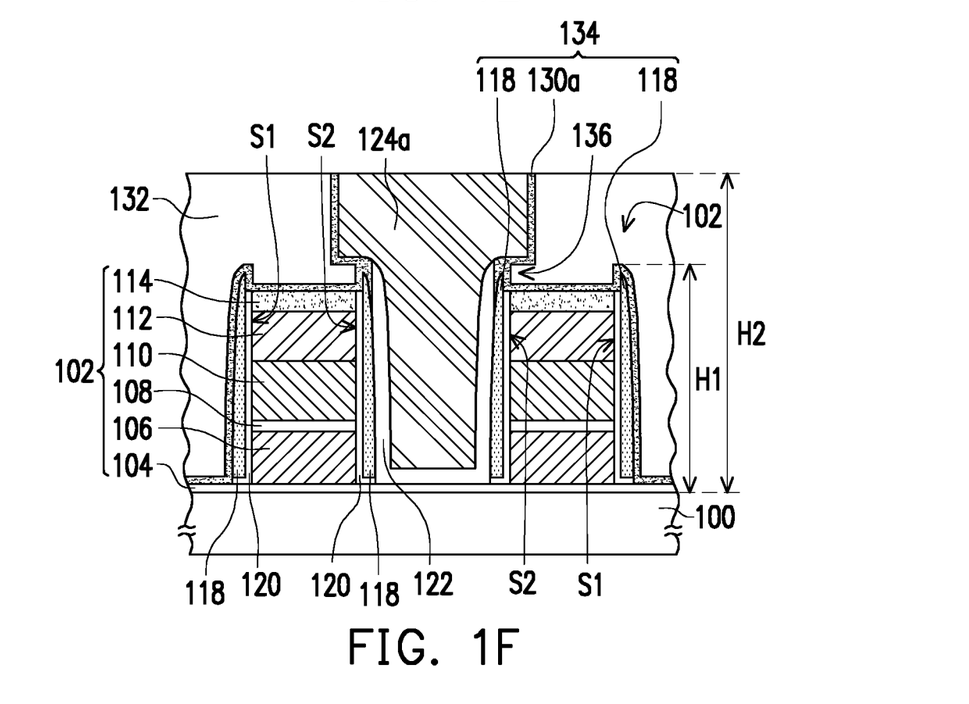

Referring to FIG. 1F, a portion of the fourth dielectric layer 132, the patterned hard mask layer 128, and a portion of the liner layer 130 can be removed to expose the top surface of the sacrificial layer 124a, wherein the liner layer 130 not removed forms a protective layer 130a. The protective layer 130a is connected to the first spacer 118 to form a protective layer structure 134. The removal method of the portion of the fourth dielectric layer 132 and the portion of the liner layer 130 is, for instance, a chemical mechanical polishing method.

Accordingly, a protective layer structure 134 covering the top surface of the memory cell structure 102, the sidewall of the first side S1, and the sidewall of the second side S2 can be formed. The material of the protective layer structure 134 is nitride. The protective layer structure 134 is a continuous structure. In the present embodiment, "continuous structure" indicates that the connection relationship between each component (such as the protective layer 130a and the first spacer 118) in the protective layer structure 134 is direct connection to form a continuous film layer. A height H2 of the protective layer structure 134 adjacent to the second side S2 of the memory cell structure 102 is greater than a height H1 of the protective layer structure 134 adjacent to the first side S1 of the memory cell structure 102. Accordingly, the protective layer structure 134 adjacent to the second side S2 of the memory cell structure 102 can have a greater thickness. A portion of the protective layer 130a adjacent to the second side S2 of the memory cell structure 102 can have a notch 136, and the notch 136 faces the first side S1 of the memory cell structure 102.

Figure 1G:
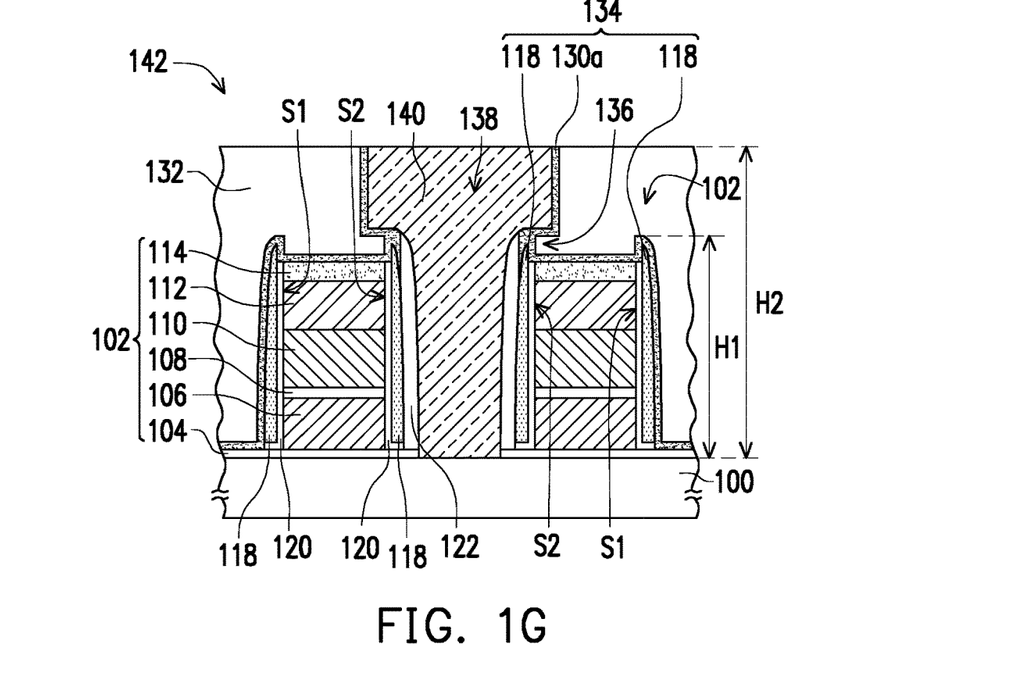

Referring to FIG. 1G, the sacrificial layer 124a can be removed to form a second opening 138 in the fourth dielectric layer 132. The removal method of the sacrificial layer 124a is, for instance, a dry etching method.

Next, the third dielectric layer 122 and the first dielectric layer 104 exposed by the second opening 138 and located on the substrate 100 can be removed. The removal method of the portion of the third dielectric layer 122 and the portion of the first dielectric layer 104 is, for instance, a dry etching method.

Next, a second conductive layer 140 can be formed in the second opening 138. The material of the second conductive layer 140 is, for instance, metal, such as tungsten. The forming method of the second conductive layer 140 is, for instance, a damascene method or a combination of a deposition process and an etching process. Moreover, a barrier layer (not shown) can be optionally formed between the second conductive layer 140 and the substrate 100. The material of the barrier layer can be Ti, TiN, or a combination thereof.

Based on the above embodiments, it can be known that, in the manufacturing method of the memory structure 142, the material of the protective layer structure 134 is nitride, the protective layer structure 134 is a continuous structure, and the height H2 of the protective layer structure 134 adjacent to the second side S2 of the memory cell structure 102 is greater than the height H1 of the protective layer structure 134 adjacent to the first side S1 of the memory cell structure 102. Therefore, the protective layer structure 134 has better coverage for the memory cell structure 102, such that the memory structure 142 can have better high-temperature data retention capacity. As a result, the reliability and the yield of the memory structure 142 can be increased.

In the following, the memory structure 142 of the above embodiments is described with FIG. 1G.

Referring to FIG. 1G, the memory structure 142 includes a substrate 100, a memory cell structure 102, and a protective layer structure 134. Moreover, the memory structure 142 can further include at least one of a first spacer 118, a second spacer 120, a third dielectric layer 122, a fourth dielectric layer 132, and a second conductive layer 140. The memory cell structure 102 is disposed on the substrate 100 and has a first side S1 and a second side S2 opposite to each other. The protective layer structure 134 covers the memory cell structure 102. The material of the protective layer structure 134 is nitride. The protective layer structure 134 is a continuous structure. A height H2 of the protective layer structure 134 adjacent to the second side S2 of the memory cell structure 102 is greater than a height H1 of the protective layer structure 134 adjacent to the first side S1 of the memory cell structure 102. The protective layer structure 134 can include a protective layer 130a and a first spacer 118. The protective layer 130a is disposed on the top surface of the memory cell structure 102 and on the first spacer 118 of the first side S1 of the memory cell structure 102. The first spacer 118 is disposed on the sidewall of the first side S1 of the memory cell structure 102 and on the sidewall of the second side S2 of the memory cell structure 102 and connected to the protective layer 130a. A portion of the protective layer 130a adjacent to the second side S2 of the memory cell structure 102 can have a notch 136, and the notch 136 faces the first side S1 of the memory cell structure 102. The second spacer 120 is disposed between the first spacer 118 and the memory cell structure 102. The third dielectric layer 122 covers the first spacer 118 located at the second side S2 of the memory cell structure 102. The fourth dielectric layer 132 covers the memory cell structure 102 and has a second opening 138. The second opening 138 exposes the substrate 100 located at the second side S2 of the memory cell structure 102. The second conductive layer 140 is filled in the second opening 138. Moreover, the material, properties, forming method, and disposition of each component of the memory structure 142 are described in detail in the embodiments above and are not repeated herein.

Similar components of FIG. 2A to FIG. 2G and FIG. 1B adopt the same reference numerals and are not repeated herein.

Figure 2A:
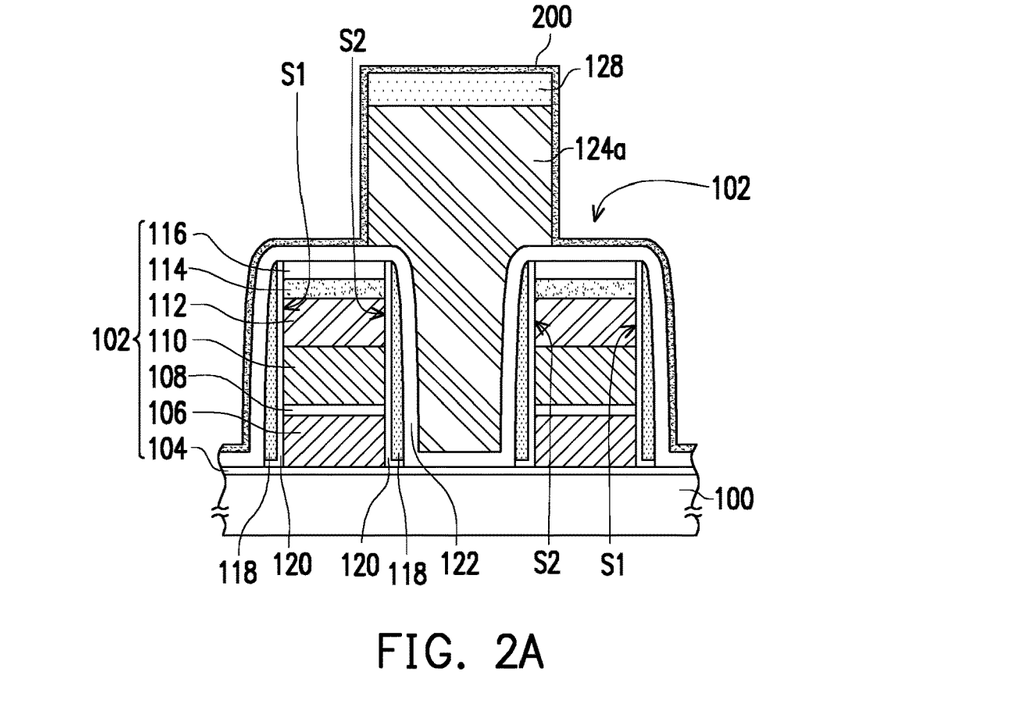
FIG. 2A to FIG. 2G are cross sections of a manufacturing process of a memory structure of another embodiment of the invention after the step of FIG. 1B.

Referring to FIG. 2A, a liner layer 200 can be conformally formed on the third dielectric layer 122, on the sacrificial layer 124a, and on the patterned hard mask layer 128. The material of the liner layer 200 is, for instance, nitride, such as silicon nitride. The forming method of the liner layer 200 is, for instance, a chemical vapor deposition method.

Figure 2B:
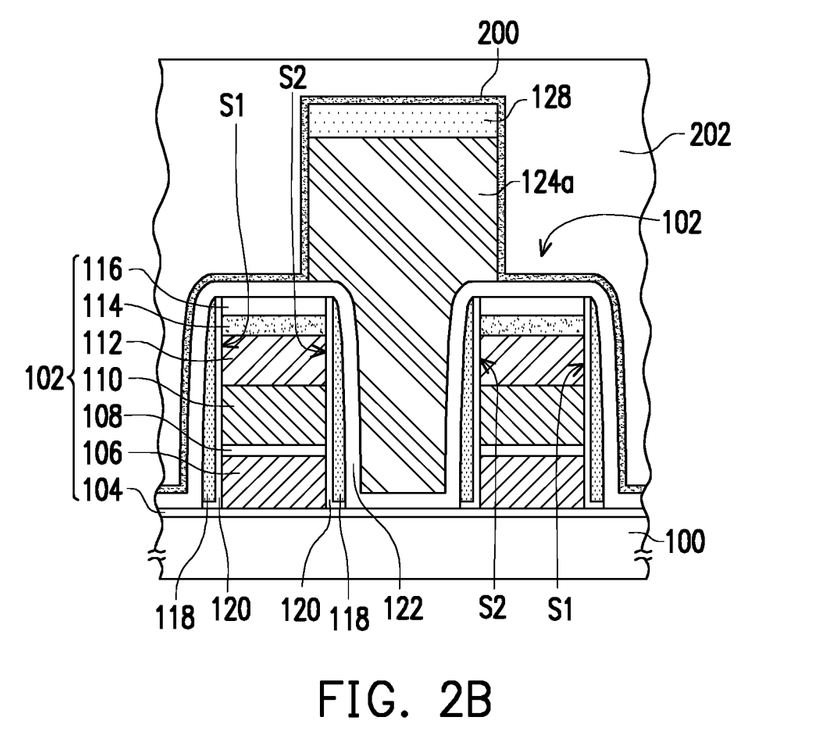

Referring to FIG. 2B, a fourth dielectric layer 202 covering the liner layer 200 can be formed. The material of the fourth dielectric layer 202 is, for instance, oxide, such as borophosphosilicate glass (BPSG). The forming method of the fourth dielectric layer 202 is, for instance, a chemical vapor deposition method.

Figure 2C:
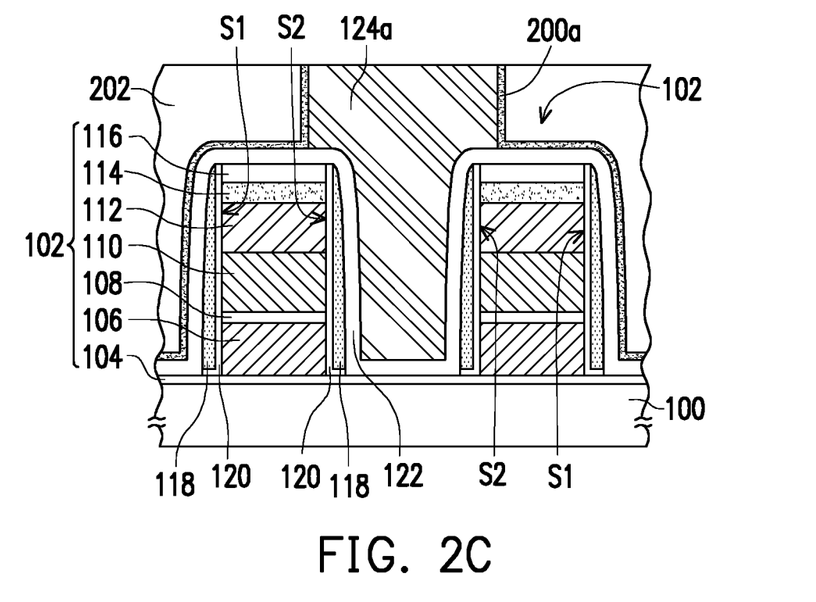

Referring to FIG. 2C, a portion of the fourth dielectric layer 202, the patterned hard mask layer 128, and a portion of the liner layer 200 can be removed to expose the top surface of the sacrificial layer 124a, wherein the liner layer 200 not removed forms a first protective layer 200a. The removal method of the portion of the fourth dielectric layer 202 and the portion of the liner layer 200 is, for instance, a chemical mechanical polishing method.

Figure 2D:
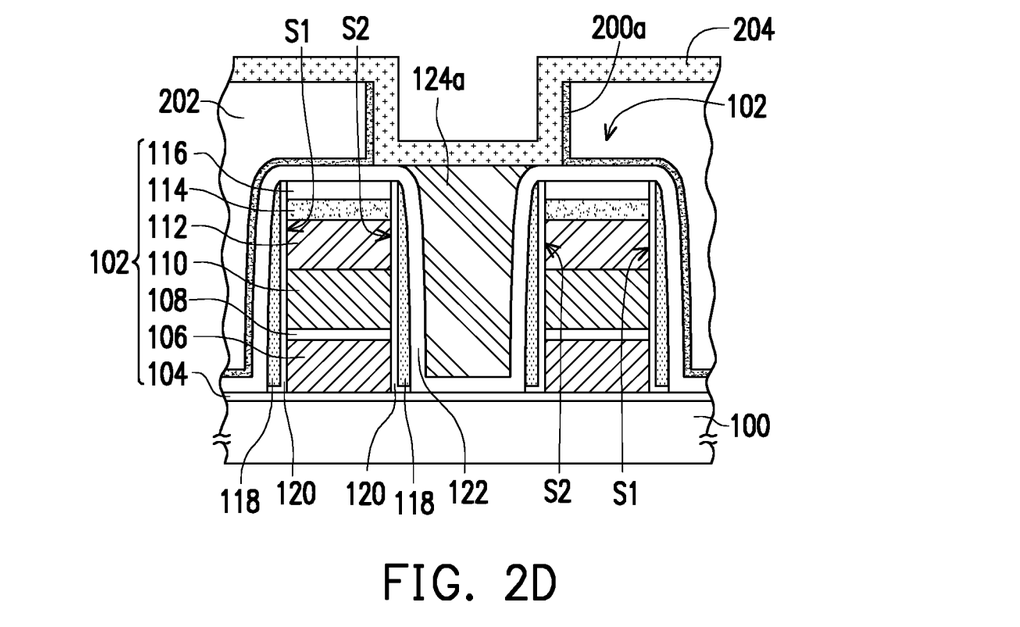

Referring to FIG. 2D, a portion of the sacrificial layer 124a can be removed until the third dielectric layer 122 located on the top surface of the memory cell structure 102 adjacent to the second side S2 is exposed. In another embodiment, when the third dielectric layer 122 is not formed, a portion of the sacrificial layer 124a can be removed until the top surface of the memory cell structure 102 adjacent to the second side S2 is exposed. The removal method of the portion of the sacrificial layer 124a is, for instance, a dry etching method.

Next, a second protective material layer 204 can be conformally formed on the fourth dielectric layer 202, on the first protective layer 200a, on the third dielectric layer 122, and on the sacrificial layer 124a. The material of the second protective material layer 204 is, for instance, nitride, such as silicon nitride. The forming method of the second protective material layer 204 is, for instance, a chemical vapor deposition method.

Figure 2E:
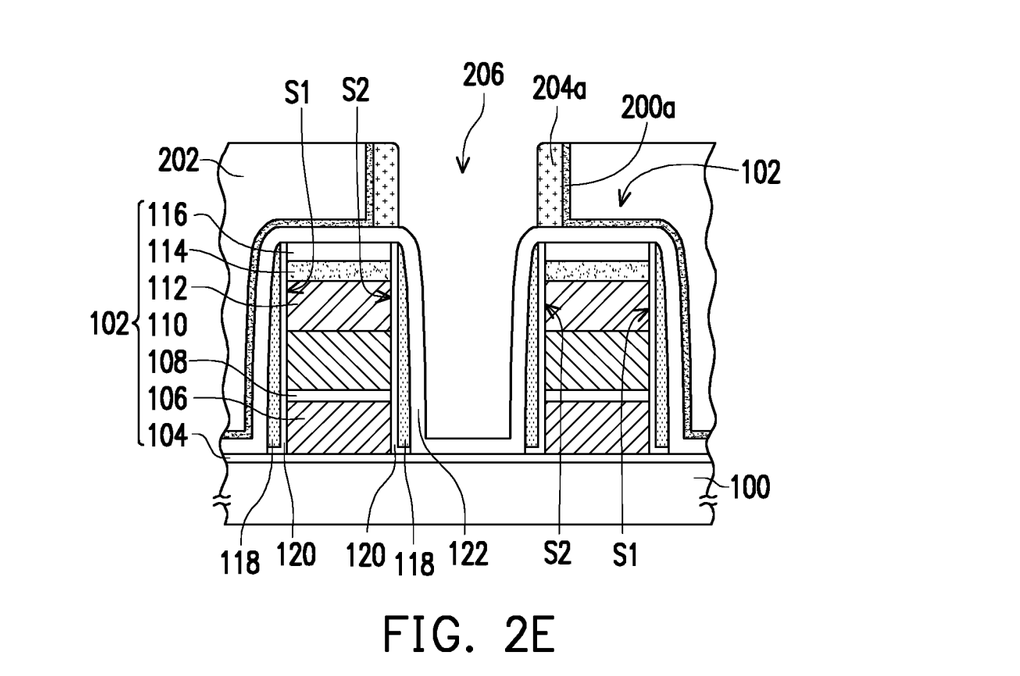

Referring to FIG. 2E, an etch-back process can be performed on the second protective material layer 204 to form a second protective layer 204a on the top surface of the memory cell structure 102 adjacent to the second side S2, wherein the second protective layer 204a is connected to the first protective layer 200a. The etch-back process is, for instance, a dry etching process.

Next, the sacrificial layer 124a can be removed to form a second opening 206 in the fourth dielectric layer 202. The removal method of the sacrificial layer 124a is, for instance, a dry etching method.

Figure 2F:
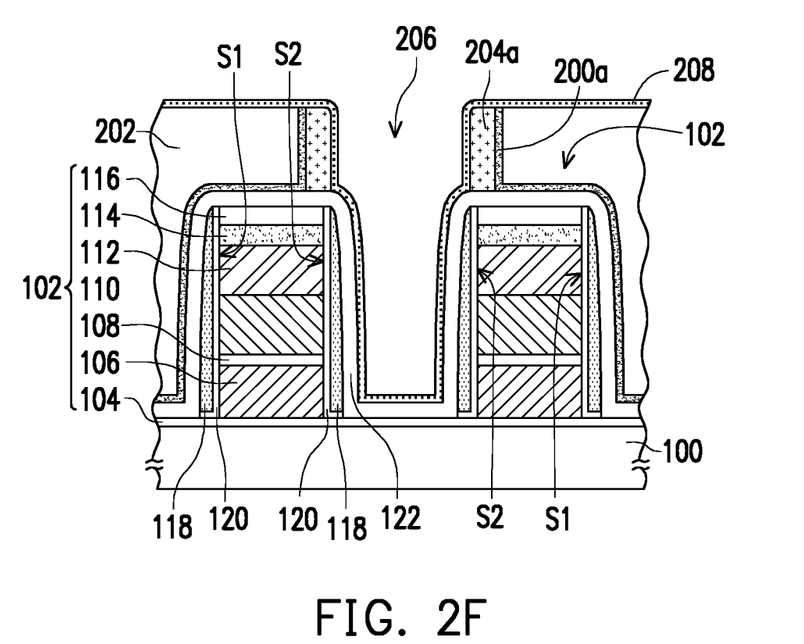

Referring to FIG. 2F, a third protective material layer 208 is conformally formed on the fourth dielectric layer 202, on the first protective layer 200a, on the second protective layer 204a, and on the third dielectric layer 122. The material of the third protective material layer 208 is, for instance, nitride, such as silicon nitride. The forming method of the third protective material layer 208 is, for instance, a chemical vapor deposition method.

Figure 2G:
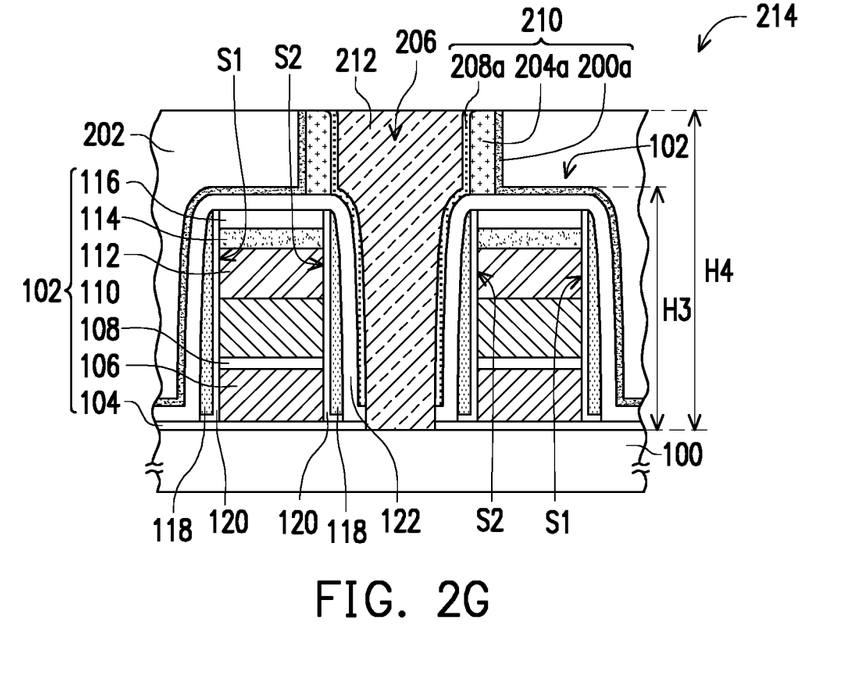

Referring to FIG. 2G, an etch-back process is performed on the third protective material layer 208, and a third protective layer 208a is formed on the sidewall of the second side S2 of the memory cell structure 102 and on the second protective layer 204a. The third protective layer 208a is connected to the second protective layer 204a. The etch-back process is, for instance, a dry etching process.

Accordingly, a protective layer structure 210 covering the memory cell structure 102 can be formed by the first protective layer 200a, the second protective layer 204a, and the third protective layer 208a. Specifically, the protective layer structure 210 can cover the top surface of the memory cell structure 102, the sidewall of the first side S1, and the sidewall of the second side S2. The material of the protective layer structure 210 is nitride. The protective layer structure 210 is a continuous structure. In the present embodiment, "continuous structure" indicates that the connection relationship between each component (such as the first protective layer 200a, the second protective layer 204a, and the third protective layer 208a) in the protective layer structure 210 is direct connection to form a continuous film layer. A height H4 of the protective layer structure 210 adjacent to the second side S2 of the memory cell structure 102 is greater than a height H3 of the protective layer structure 210 adjacent to the first side S1 of the memory cell structure 102. Accordingly, the protective layer structure 210 adjacent to the second side S2 of the memory cell structure 102 can have a greater thickness.

Next, the third dielectric layer 122 and the first dielectric layer 104 exposed by the second opening 206 and located on the substrate 100 can be removed. The removal method of the portion of the third dielectric layer 122 and the portion of the first dielectric layer 104 is, for instance, a dry etching method.

Next, a second conductive layer 212 can be formed in the second opening 206. The material of the second conductive layer 212 is, for instance, metal, such as tungsten. The forming method of the second conductive layer 212 is, for instance, a damascene method or a combination of a deposition process and an etching process. Moreover, a barrier layer (not shown) can be optionally formed between the second conductive layer 212 and the substrate 100. The material of the barrier layer can be Ti, TiN, or a combination thereof.

Based on the above embodiments, it can be known that, in the manufacturing method of the memory structure 214, the material of the protective layer structure 210 is nitride, the protective layer structure 210 is a continuous structure, and the height H4 of the protective layer structure 210 adjacent to the second side S2 of the memory cell structure 102 is greater than the height H3 of the protective layer structure 210 adjacent to the first side S1 of the memory cell structure 102. Therefore, the protective layer structure 210 has better coverage for the memory cell structure 102, such that the memory structure 214 can have better high-temperature data retention capacity. As a result, the reliability and the yield of the memory structure 214 can be increased.

In the following, the memory structure 214 of the above embodiments is described with FIG. 2G.

Referring to FIG. 2G, the memory structure 214 includes a substrate 100, a memory cell structure 102, and a protective layer structure 210. Moreover, the memory structure 214 can further include at least one of a first spacer 118, a second spacer 120, a third dielectric layer 122, a fourth dielectric layer 202, and a second conductive layer 212. The memory cell structure 102 is disposed on the substrate 100 and has a first side S1 and a second side S2 opposite to each other. The protective layer structure 210 covers the memory cell structure 102. The material of the protective layer structure 210 is nitride. The protective layer structure 210 is a continuous structure. A height H4 of the protective layer structure 210 adjacent to the second side S2 of the memory cell structure 102 is greater than a height H3 of the protective layer structure 210 adjacent to the first side S1 of the memory cell structure 102. The protective layer structure 210 includes a first protective layer 200a, a second protective layer 204a, and a third protective layer 208a. The first protective layer 200a is disposed on the top surface of the memory cell structure 102 and on the sidewall of the first side S1 of the memory cell structure 102. The second protective layer 204a is disposed on the top surface of the memory cell structure 102 adjacent to the second side S2 and connected to the first protective layer 200a. The third protective layer 208a is disposed on the sidewall of the second side S2 of the memory cell structure 102 and on the second protective layer 204a and connected to the second protective layer 204a. The first spacer 118 is disposed on the sidewall of the first side S1 of the memory cell structure 102 and on the sidewall of the second side S2 of the memory cell structure 102. The second spacer 120 is disposed between the first spacer 118 and the memory cell structure 102. The third dielectric layer 122 covers the first spacer 118 located at the second side S2 of the memory cell structure 102 and can further cover the top surface of the memory cell structure 102 and the first spacer 118 located at the first side S1 of the memory cell structure 102. The fourth dielectric layer 202 covers the memory cell structure 102 and has a second opening 206. The second opening 206 exposes the substrate 100 located at the second side S2 of the memory cell structure 102. The second conductive layer 212 is filled in the second opening 206. Moreover, the material, properties, forming method, and disposition of each component of the memory structure 214 are described in detail in the embodiments above and are not repeated herein.

Based on the above, in the memory structure and the manufacturing method thereof of the embodiments, the material of the protective layer structure is nitride, the protective layer structure is a continuous structure, and the height of the protective layer structure adjacent to the second side of the memory cell structure is greater than the height of the protective layer structure adjacent to the first side of the memory cell structure. Therefore, the protective layer structure has better coverage for the memory cell structure, such that the memory structure can have better high-temperature data retention capacity. As a result, the reliability and the yield of the memory structure can be increased.

Although the invention has been described with reference to the above embodiments, it will be apparent to one of ordinary skill in the art that modifications to the described embodiments may be made without departing from the spirit of the invention. Accordingly, the scope of the invention is defined by the attached claims not by the above detailed descriptions.

What is claimed is:

1. A manufacturing method of a memory structure, comprising: forming a memory cell structure on a substrate, wherein the memory cell structure has a first side and a second side opposite to each other; and forming a protective layer structure covering the memory cell structure, wherein a material of the protective layer structure is nitride, the protective layer structure is a continuous structure, a height of the protective layer structure adjacent to the second side of the memory cell structure is greater than a height of the protective layer structure adjacent to the first side of the memory cell structure, and a forming method of the protective layer structure comprises: forming a first spacer on a sidewall of the first side of the memory cell structure and on a sidewall of the second side of the memory cell structure: forming a third dielectric layer covering the memory cell structure and the first spacer; forming a sacrificial layer filled in a first opening located at the second side of the memory cell structure, wherein the sacrificial layer covers the third dielectric layer located on a top surface of the memory cell structure adjacent to the second side: removing a portion of the third dielectric layer, exposing the first spacer located at the first side of the memory cell structure and exposing a top portion of the first spacer located at the second side of the memory cell structure; conformally forming a liner layer on the memory cell structure and on the sacrificial layer, wherein the liner layer is connected to the first spacer; forming a fourth dielectric layer covering the liner layer; and removing a portion of the fourth dielectric layer and a portion of the liner layer to expose a top surface of the sacrificial layer wherein the liner layer not removed from protective layer, and the protective layer is connected to the first spacer to form the protective layer structure.

2. The manufacturing method of the memory structure of claim 1, father comprising:
    removing the sacrificial layer to form a second opening in the fourth dielectric layer;
    removing the third dielectric layer exposed by the second opening and located on the substrate; and
    forming a second conductive layer in the second opening.

3. A manufacturing method of a memory structure, comprising:

forming a memory cell structure on a substrate, wherein the memory cell structure has a first side and a second side opposite to each other; and forming a protective layer structure covering the memory cell structure, wherein a material of the protective layer structure is nitride, the protective layer structure is a continuous structure, a height of the protective layer structure adjacent to the second side of the memory cell structure is greater than a height of the protective layer structure adjacent to the first side of the memory cell structure, and a forming method of the protective layer structure comprises:

forming a sacrificial layer filled in a first opening located at the second side of the memory cell structure, wherein the sacrificial layer covers a top surface of the memory cell structure adjacent to the second side;

conformally forming a liner layer on the memory cell structure and on the sacrificial layer;

forming a fourth dielectric layer covering the liner layer;

removing a portion of the fourth dielectric layer and a portion of the liner layer to expose a top surface of the sacrificial layer, wherein the liner layer not removed forms a first protective layer;

removing a portion of the sacrificial layer until the top surface of the memory cell structure adjacent to the second side is exposed;

forming a second protective layer on the top surface of the memory cell structure adjacent to the second side, wherein the second protective layer is connected to the first protective layer;

removing the sacrificial layer to form a second opening in the fourth dielectric layer; and     forming a third protective layer on a sidewall of the second side of the memory cell structure and on the second protective layer, wherein the third protective layer is connected to the second protective layer, wherein the protective layer structure is formed by the first protective layer, the second protective layer, and the third protective layer.

4. The manufacturing method of the memory structure of claim 3, wherein a forming method of the second protective layer structure comprises:

conformally forming a second protective material layer on the fourth dielectric layer, on the first protective layer, on the memory cell structure, and on the sacrificial layer; and     performing an etch-back process on the second protective material layer.

5. The manufacturing method of the memory structure of claim 3, wherein a forming method of the third protective layer structure comprises:

conformally forming a third protective material layer on the fourth dielectric layer, on the first protective layer, on the second protective layer, and on the memory cell structure; and     performing an etch-back process on the third protective material layer.

6. The manufacturing method of the memory structure of claim 3, further comprising, before the sacrificial layer is formed, forming a first spacer on a sidewall of the first side of the memory cell structure and on the sidewall of the second side of the memory cell structure.

7. The manufacturing method of the memory structure of claim 6, further comprising:

forming a third dielectric layer covering the memory cell structure and the first spacer;

removing the third dielectric layer exposed by the second opening and located on the substrate; and     forming a second conductive layer in the second opening.

* * * * *